(12) United States Patent
Duchesne et al.

(10) Patent No.: US 9,476,925 B2
(45) Date of Patent: Oct. 25, 2016

(54) METHOD AND DEVICE FOR ELECTROMAGNETICALLY TESTING AN OBJECT

(75) Inventors: Luc Duchesne, Angervilliers (FR); Raphaël Laporte, Bois Colombes (FR)

(73) Assignee: Satimo Industries (FR)

(*) Notice: Subject to any disclaimer, the term of this patent is extended or adjusted under 35 U.S.C. 154(b) by 518 days.

(21) Appl. No.: 13/878,365

(22) PCT Filed: Oct. 7, 2011

(86) PCT No.: PCT/EP2011/067598
§ 371 (c)(1),
(2), (4) Date: Apr. 8, 2013

(87) PCT Pub. No.: WO2012/045879
PCT Pub. Date: Apr. 12, 2012

(65) Prior Publication Data
US 2013/0187815 A1    Jul. 25, 2013

(30) Foreign Application Priority Data
Oct. 8, 2010  (FR) ...................... 10 58193

(51) Int. Cl.
*G01R 29/10*    (2006.01)
*G01R 29/08*    (2006.01)

(52) U.S. Cl.
CPC ........... *G01R 29/10* (2013.01); *G01R 29/0892* (2013.01); *G01R 29/105* (2013.01)

(58) Field of Classification Search
None
See application file for complete search history.

(56) References Cited

U.S. PATENT DOCUMENTS 3,879,733 A * 4/1975 Hansen ............... G01R 29/10
                                                342/360
4,201,987 A * 5/1980 Tricoles ............... G01R 29/10
                                                343/703
4,453,164 A * 6/1984 Patton ................ H01Q 3/267
                                                342/360
4,661,820 A * 4/1987 Pouit .................. G01R 29/10
                                                342/351

(Continued)

FOREIGN PATENT DOCUMENTS

| CN | 1846139 A | 10/2006 |
|---|---|---|
| FR | 2797327 A1 | 2/2001 |
| JP | 2001004738 A | 1/2001 |
| WO | 2006047677 A1 | 5/2006 |
| WO | 2010006891 A1 | 1/2010 |

OTHER PUBLICATIONS

French Preliminary Search Report for Application FR1058193 dated Jun. 20, 2011.
Internation Search Report for Application PCT/EP2011/067598 dated Jan. 27, 2012.
Iwai et al., Spatial Fading Emulator for Handset Antennas, pp. 218-221, 2005.

(Continued)

*Primary Examiner* — Jermele M Hollington
*Assistant Examiner* — Suresh K Rajaputra
(74) *Attorney, Agent, or Firm* — Lerner, David, Littenberg, Krumholz & Mentlik, LLP

(57) ABSTRACT

The invention relates to a method for electromagnetically testing an object, a method in which electromagnetic radiation is directed by a probe in a predetermined main aiming direction toward a predetermined test point at which the object is located. The invention is characterized in that the probe and a stand for the object are moved relative to one another by a mechanical moving device according to a movement representative of a predetermined angular spread statistic relative to the main aiming direction, in order to generate, by means of the probe, electromagnetic radiation having said predetermined angular spread statistic relative to the main aiming direction.

25 Claims, 12 Drawing Sheets

(56) References Cited

U.S. PATENT DOCUMENTS

Figure 1:
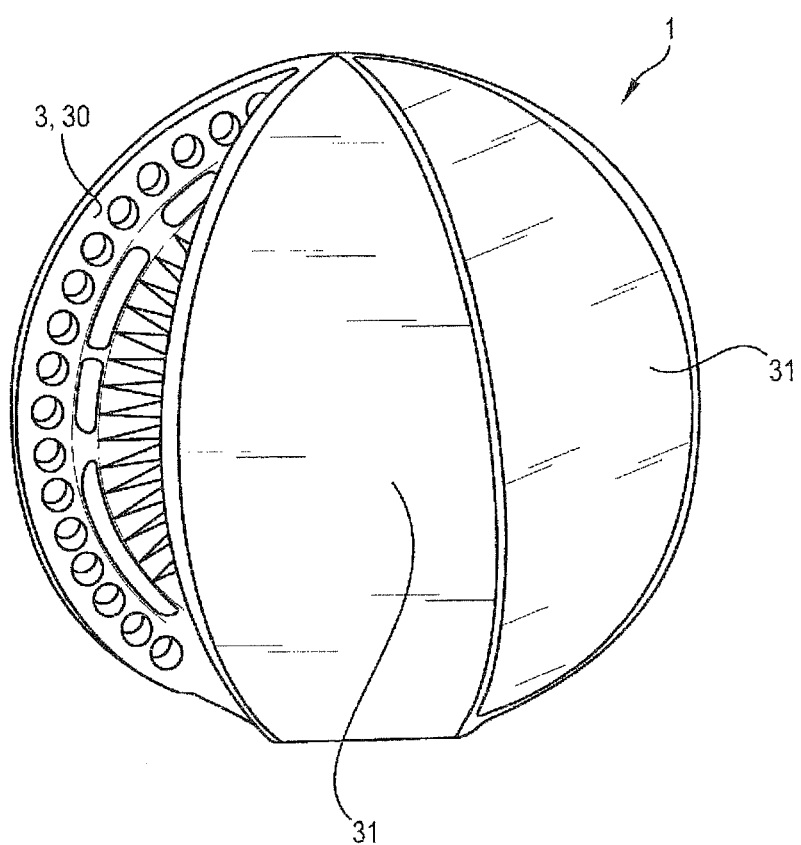

| | | | | | |
|---|---|---|---|---|---|
| 4,704,614 | A * | 11/1987 | Poirier | G01R 29/10 | 324/95 |
| 5,270,723 | A * | 12/1993 | Lopez | H01Q 3/267 | 343/703 |
| 5,365,241 | A * | 11/1994 | Williams | H01Q 3/16 | 343/703 |
| 5,410,319 | A * | 4/1995 | Lopez | H01Q 3/267 | 342/173 |
| 5,432,523 | A * | 7/1995 | Simmers | G01R 29/10 | 342/360 |
| 5,473,335 | A * | 12/1995 | Tines | H01Q 3/04 | 248/652 |
| 5,485,158 | A * | 1/1996 | Mailloux | G01R 29/10 | 342/165 |
| 5,530,412 | A * | 6/1996 | Goldblum | G01R 29/0821 | 324/633 |
| 5,973,638 | A * | 10/1999 | Robbins | H01Q 3/267 | 342/171 |
| 6,021,315 | A * | 2/2000 | Telewski | H04W 24/00 | 343/703 |
| 6,097,333 | A * | 8/2000 | Otto | B22F 3/115 | 342/118 |
| 6,191,744 | B1 * | 2/2001 | Snow | G01R 29/10 | 342/360 |
| 6,236,363 | B1 * | 5/2001 | Robbins | H01Q 3/267 | 342/169 |
| 6,850,851 | B1 * | 2/2005 | Fourestie | G01R 29/0814 | 324/76.11 |
| 6,859,047 | B2 * | 2/2005 | Hemming | G01R 29/0821 | 324/637 |
| 6,885,348 | B1 * | 4/2005 | Ryken, Jr. | G01R 29/105 | 324/627 |
| 7,035,594 | B2 * | 4/2006 | Wallace et al. | 455/67.12 | |
| 7,224,758 | B1 * | 5/2007 | Banister | H04B 7/0634 | 375/358 |
| 7,286,961 | B2 * | 10/2007 | Kildal | G01R 29/105 | 702/182 |
| 7,359,701 | B2 * | 4/2008 | Zhao | H04B 17/0082 | 455/423 |
| 7,443,170 | B2 * | 10/2008 | Garreau | G01R 29/0821 | 324/501 |
| 7,444,264 | B2 * | 10/2008 | Kildal | G01R 29/105 | 343/703 |
| 7,508,868 | B2 * | 3/2009 | Chang | H04B 17/0087 | 375/224 |
| 7,554,339 | B2 * | 6/2009 | Horton | G01N 27/72 | 324/627 |
| 7,599,687 | B2 * | 10/2009 | Zhao | H04B 17/0082 | 455/423 |
| 7,642,973 | B2 * | 1/2010 | Maekawa | G01R 29/0814 | 324/754.23 |
| 7,672,640 | B2 * | 3/2010 | Nyshadham | G01R 29/0878 | 342/153 |
| 7,773,964 | B2 * | 8/2010 | Ozaki | G01R 29/10 | 455/115.1 |
| 7,791,355 | B1 * | 9/2010 | Esher | G01N 22/00 | 324/637 |
| 7,873,339 | B2 * | 1/2011 | Qi | H04B 17/309 | 455/226.2 |
| 7,876,276 | B1 * | 1/2011 | Zaman | G01R 29/105 | 343/703 |
| 7,880,670 | B2 * | 2/2011 | Villarroel | G01R 29/0871 | 342/165 |
| 7,925,253 | B2 * | 4/2011 | Breit | G01R 29/105 | 455/226.1 |
| 7,949,334 | B2 * | 5/2011 | Lorenzen | H04W 24/06 | 455/115.1 |
| 7,965,986 | B2 * | 6/2011 | Foegelle | H04W 24/00 | 324/627 |
| 7,994,991 | B2 * | 8/2011 | Grange | G01R 29/0871 | 343/703 |
| 8,004,455 | B1 * | 8/2011 | Wright | H04B 7/0602 | 342/165 |
| 8,018,380 | B2 * | 9/2011 | Oh | G01R 29/10 | 342/360 |
| 8,047,518 | B2 * | 11/2011 | Grange | H01Q 3/02 | 269/289 MR |
| 8,095,185 | B2 * | 1/2012 | Stephenne | 455/562.1 | |
| 8,228,247 | B2 * | 7/2012 | Kitada | G01R 29/105 | 343/703 |
| 8,326,229 | B2 * | 12/2012 | Foegelle | H04W 24/00 | 324/627 |
| 8,331,869 | B2 * | 12/2012 | Foegelle | H04B 17/0082 | 455/115.2 |
| 8,335,347 | B2 * | 12/2012 | Grange | G01S 5/163 | 382/103 |
| 8,340,590 | B2 * | 12/2012 | Zhao | H04B 17/0082 | 455/115.2 |
| 8,358,992 | B2 * | 1/2013 | Yu | H04B 17/10 | 324/627 |
| 8,395,556 | B2 * | 3/2013 | Peng | G01R 29/10 | 343/701 |
| 8,410,987 | B2 * | 4/2013 | Eibert | G01R 29/10 | 343/703 |
| 8,412,112 | B2 * | 4/2013 | Foegelle | H04B 17/21 | 455/67.11 |
| 8,467,756 | B2 * | 6/2013 | Ozaki | G01R 29/10 | 455/115.1 |
| 8,471,774 | B2 * | 6/2013 | Oh | G01R 29/10 | 342/360 |
| 8,482,294 | B2 * | 7/2013 | Garreau | G01R 29/0821 | 324/501 |
| 8,643,553 | B2 * | 2/2014 | Teshirogi | G01R 29/10 | 343/703 |
| 8,655,284 | B2 * | 2/2014 | Foegelle | H04W 24/00 | 324/627 |
| 8,706,044 | B2 * | 4/2014 | Chang | H04W 24/06 | 455/67.11 |
| 8,718,567 | B2 * | 5/2014 | Venkataraman | H04B 17/24 | 455/115.1 |
| 8,744,368 | B2 * | 6/2014 | Kothari | H03K 3/0315 | 327/564 |
| 8,774,727 | B2 * | 7/2014 | Freiherr Von Gagern | H04B 17/336 | 455/115.1 |
| 8,793,093 | B2 * | 7/2014 | Mow | H04B 17/0087 | 455/67.12 |
| 8,880,002 | B2 * | 11/2014 | Falck | H01Q 3/24 | 343/703 |
| 8,903,326 | B2 * | 12/2014 | Gregg | H04L 12/2697 | 455/67.12 |
| 8,913,963 | B2 * | 12/2014 | Lundstrom | H04B 17/3912 | 455/67.11 |
| 8,913,964 | B2 * | 12/2014 | Lundstrom | H04B 17/3912 | 455/67.11 |
| 8,954,014 | B2 * | 2/2015 | Kyosti | G01R 29/0814 | 370/310 |
| 9,002,287 | B2 * | 4/2015 | Mow | G01R 29/10 | 455/13.3 |
| 9,179,340 | B2 * | 11/2015 | Foegelle | H04W 24/00 | |
| 2003/0003883 | A1 * | 1/2003 | Wallace | H01Q 3/26 | 455/115.1 |
| 2005/0128150 | A1 * | 6/2005 | Chen | G01R 29/10 | 343/702 |
| 2007/0287385 | A1 * | 12/2007 | Stephenne | H04B 7/08 | 455/67.11 |
| 2008/0056340 | A1 | 3/2008 | Foegelle | | |
| 2011/0189962 | A1 * | 8/2011 | Kyosti | H01Q 21/20 | 455/67.11 |
| 2011/0191090 | A1 * | 8/2011 | Kyosti | H01Q 21/20 | 703/13 |
| 2012/0286122 | A1 * | 11/2012 | Tankielun | G01R 29/0864 | 248/346.06 |

OTHER PUBLICATIONS

Sakata et al., BER Evaluation System for a Handset Antenna in a Multipath Environment Using a Spatial Fading Emulator, pp. 351-354, 2005.
SATIMO Antenna Measurement, StarLab, Aug. 2008.

* cited by examiner

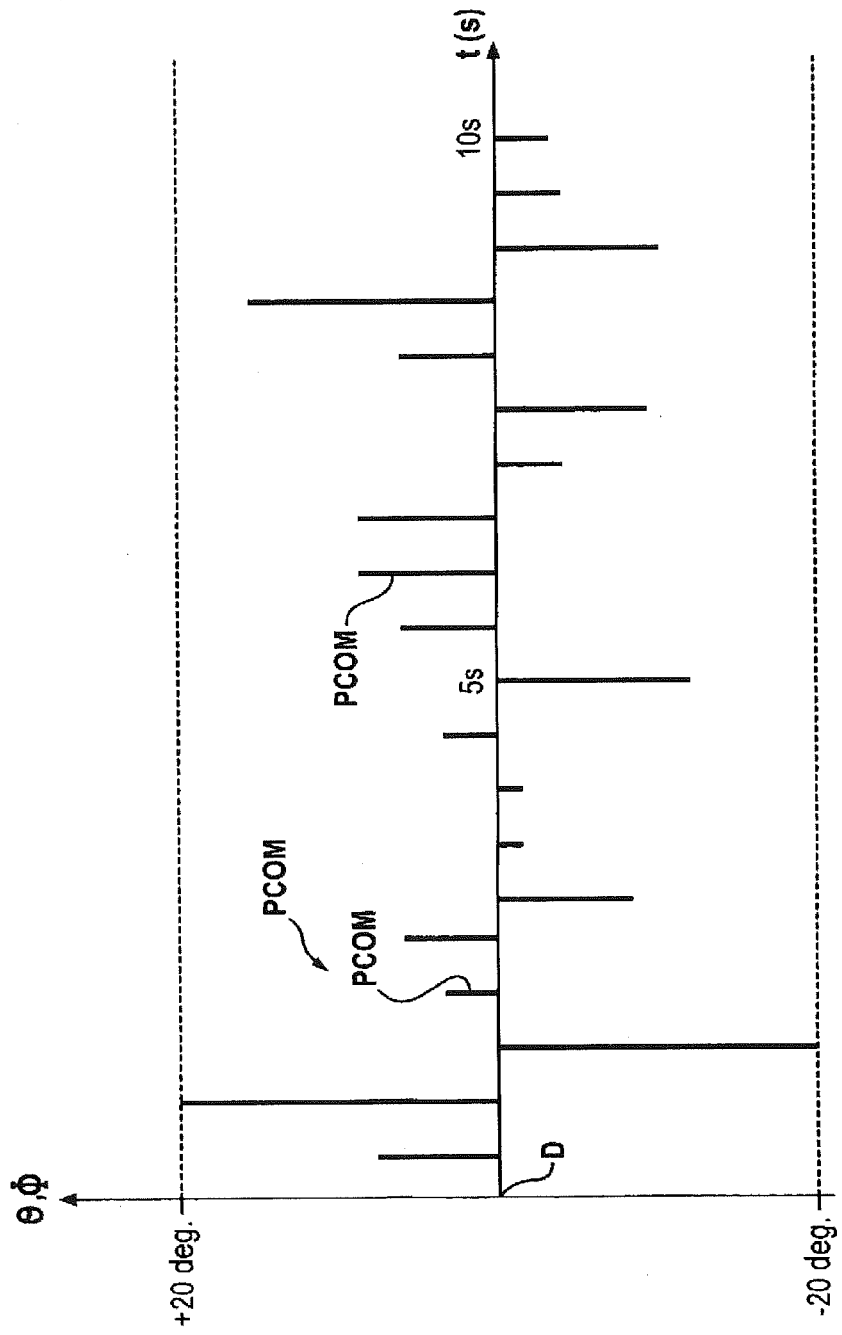

METHOD AND DEVICE FOR ELECTROMAGNETICALLY TESTING AN OBJECT

CROSS REFERENCE TO RELATED APPLICATIONS

The present application is a national phase entry under 35 U.S.C. §371 of International Application No. PCT/EP2011/067598, filed Oct. 7, 2011, published in French, which claims priority from French Patent Application No. 1058193, filed Oct. 8, 2010, the disclosures of which are incorporated by reference herein.

The invention relates to electromagnetic testing of objects, such as for example antennas and more generally testing radiating objects comprising antennas connected to a source and/or an integrated receiver, the radiating elements being considered as either transmitters and/or receivers of electromagnetic radiations.

In different applications, the aim is to know the response of radiating objects to external electromagnetic radiation.

Tests on mobile phones or portable computers can be cited ase examples.

In general, when one or more antennas is used on equipment, the latter can be subjected to different electromagnetic radiations, which can vary over time and can for example perturb reception of a useful signal.

In the case of an object being tested comprising one or more receiving antennas, the difficulty is evaluating how this object being tested will react to electromagnetic radiations which can occur during its use in real conditions.

A particular aim is to generate by one or more probes for emission of electromagnetic radiation pointed towards the object being tested an electromagnetic scenario representative of the real operating environment of the object being tested, that is, sending to each probe an input signal representative of an electromagnetic scenario, as a function of which it will send radiation towards the object to reproduce the operating environment of the object being tested.

Such a test device is known for example from document US-A-2008/00 56 340.

The document "Spatial Fading Evaluator for Handset Antennas" by H. Iwai et al., published in I.E.E.E. 2005, pages 218 to 221, reference 0-7803-8683-6/05, also discloses a device for evaluating signals received by antennas of telephone handsets in multipath propagation or fading environments, and this by means of diffusers placed around a reception antenna.

The document "BER Evaluation System for a Handset Antenna in a Multipath Environment using a Spatial Fading Emulator" by Tsutomu Sakata et al., in "Proceeding of ISAP 2005, Seoul, Korea", reference ISBN: 89-86522-78-094460, pages 351 to 354, also describes a device of this type.

These known devices do not however generate all possible electromagnetic scenarios. Also, they are complicated to execute.

The invention aims to expand the possibilities for generation of a real electromagnetic environment by a test device which can adapt to all existing systems to enrich possible simulations.

For this purpose, the invention relates to a method for electromagnetic testing of at least one object, a method in which electromagnetic radiation is sent by at least one probe in a determined principal aiming direction towards a determined test point where the object being tested is located.

The invention is characterised in that the at least one probe and a support for the object being tested are moved relative to each other by a mechanical displacement device according to a movement representative of a predetermined angular spread statistic relative to the principal aiming direction to generate electromagnetic radiation having this predetermined angular spread statistic relative to the principal aiming direction by the at least one probe.

Thanks to the invention, the probe or the probes can be oscillated relatively about their aiming direction to generate electromagnetic radiation directed towards the test point but having a variable point of origin and therefore an angle of incidence having an angular spread in real time relative to the determined aiming direction, which is in fact a principal direction of illumination of the test point. The mechanical displacement device can shift the probe and the support of the object being tested relative to each other in real time according to a prescribed trajectory which is determined as a function of the predetermined angular spread statistic. By measuring the response of the object being tested to this angular spread statistic of the incident electromagnetic radiations, the temporal response of the object can be disclosed, wherein the angular spread statistic of the radiation is also temporal.

Other existing systems could also be used to enable to temporally vary electric control signals for controlling of the probe or probes, as a function of which the probe or the probes generate electromagnetic field values which can be regulated in intensity and/or in phase.

The movement representative of a predetermined angular spread statistic is a angular displacement of the probe controlled according to a defined statistic. At each instant, a determined control angle and determined amplitude of electrical control signals are assigned to the probe according to the statistic defined by a computer. The probe or the probes are shifted relative to the object being tested (or the object being tested relative to the probe or the probes) in a controlled manner relative to the predetermined aiming direction of the probe towards the object being tested, to reproduce a scenario of angular spread. The computer is provided to control the motor or the motors of the mechanical displacement device to move the probes and/or the object being tested according to the predetermined angular spread statistic.

The invention therefore enables to reproduce electromagnetic scenarios more pertinent to each object being tested.

According to an embodiment of the invention, said movement is located in a plane.

According to an embodiment of the invention, said movement is located in a vertical plane to generate the predetermined angular spread statistic in elevation by the displacement device.

According to an embodiment of the invention, said movement is located in a horizontal plane to generate the predetermined angular spread statistic in azimuth by the displacement device.

According to an embodiment of the invention, said movement is three-dimensional to generate the predetermined angular spread statistic in elevation and in azimuth by the displacement device.

According to an embodiment of the invention, the mechanical displacement device is provided between said at least one probe and a support structure for supporting of the at least one probe.

According to an embodiment of the invention, the mechanical displacement device comprises at least one angular displacement device of the probe in rotation around the test point according to at least one degree of liberty relative to the support structure.

According to an embodiment of the invention, said at least one probe is one or more in a network of a plurality of probes supported by a support structure, each probe having a separate principal aiming direction towards the test point.

According to an embodiment of the invention, the object being tested being fixed on the support, the mechanical displacement device makes a determined movement of the support structure for supporting the probes and of the support for the object being tested relative to each other to have said at least one probe undergo the movement representative of the predetermined angular spread statistic relative to its principal aiming direction.

According to an embodiment of the invention, the object being tested being fixed on the support, the mechanical displacement device makes a determined movement of the support structure for supporting the probes relative to the fixed support of the object being tested, to have said at least one probe undergo the movement representative of the predetermined angular spread statistic relative to its principal aiming direction.

According to an embodiment of the invention, the object being tested being fixed on the support, the mechanical displacement device makes a determined movement of the support for the object being tested relative to the fixed support structure for supporting of the probes to have said at least one probe undergo the movement representative of the predetermined angular spread statistic relative to its principal aiming direction.

According to an embodiment of the invention, the support structure is in the form of an arch or ring on which the probes are supported in a plane.

According to an embodiment of the invention, the support structure is three-dimensional in form on which the probes are supported distributed in three dimensions.

According to an embodiment of the invention, the mechanical displacement device allows at least one determined angular sliding displacement of the support structure and of the support for the object being tested relative to each other at least about a non-vertical geometric axis.

According to an embodiment of the invention, the mechanical displacement device allows a second angular rotation displacement of the support structure and of the support for the object being tested relative to each other at least about a vertical geometric axis.

According to an embodiment of the invention, the support structure rests on a lower base, provided between the base and the support structure is a second other angular displacement system for moving the support structure relative to the base by a second angle of the same absolute value opposite the angular sliding displacement of the first mechanical displacement device of the support relative to the support structure, so that the support of the object being tested retains a prescribed and substantially constant position relative to the vertical, the mechanical displacement device for the support relative to the support structure being called a first system of relative displacement.

According to an embodiment of the invention, the second other angular displacement system comprises a plurality of support rollers for supporting of an outer curved surface of a wall of the support structure on the base and at least one drive motor for driving at least one of the rollers to make said outer curved surface of the wall of the support structure roll relative to the base by said second angle.

According to an embodiment of the invention, there is also provided:

a control element for controlling of the angular sliding displacement of the first system of relative displacement, at least one measuring sensor for measuring of a real angle of the support for the object being tested relative to the vertical, a feedback loop for controlling of the drive motor as a function of the angle measured by the sensor so that the angle measured by the sensor is equal to a constant value corresponding to said prescribed position of the support relative to the vertical.

According to an embodiment of the invention, a plurality of probes is provided distributed equiangularly according to at least one spherical coordinate about the same target point of the probes.

According to an embodiment of the invention, provided on the at least one probe is an individual regulation system for regulating of the mechanical alignment of the probe relative to a target point, a target point where the object being tested on the support must be centred.

According to an embodiment of the invention, the individual regulation system for regulating of the mechanical alignment of the probe is associated to at least one optical detection camera positioned at the target point for measuring the mechanical alignment of the probe.

According to an embodiment of the invention, the individual regulation system for regulating of the mechanical alignment of the probe comprises motorisation of said probe on the support structure for shifting the probe relative to the support structure according to at least one degree of liberty other than according to a principal aiming direction of the probe towards the target point.

According to an embodiment of the invention, an analysis module of the image supplied by the camera is provided to detect in this image the trace of said probe and a feedback module for controlling of the motorisation to align the detected trace of the probe on a setpoint trace corresponding to the alignment of the probe on the target point is provided.

According to an embodiment of the invention, the predetermined angular spread statistic is a double exponential law.

According to an embodiment of the invention, the predetermined angular spread statistic is a Gaussian centred relative to the principal aiming direction and having an angular spread defined by the angular opening centred around the principal aiming direction, for which the half of the maximal energy of the radiation is transported.

According to an embodiment of the invention, at least one computer comprises an interface allowing a user to select said angular spread statistic, the computer calculates a plurality of successive angular control positions for controlling of the mechanical displacement device relative to the predetermined principal aiming direction, which appear according to said angular spread statistic having been selected, the computer sends the successive angular control positions having been calculated to at least one motor of the mechanical displacement device so that said at least one probe takes determined real successive positions corresponding to the successive control positions.

According to an embodiment of the invention, the computer calculates for each angular control position a control signal for controlling of the intensity and/or of the phase of the electromagnetic radiation emitted by said at least one probe.

The invention concerns also a device for electromagnetic testing of at least one object for executing the test method as described above, the device comprising at least one probe for emission of electromagnetic radiation in a determined principal aiming direction towards a determined test point where the object being tested is located, as well as a support for the object being tested, characterised in that the test device further comprises a mechanical displacement device for mechanically displacing of the at least one probe and of the support for the object being tested relative to each other according to a movement representative of a predetermined angular spread statistic relative to the principal aiming direction to generate electromagnetic radiation having this predetermined angular spread statistic relative to the principal aiming direction by the at least one probe.

Figure 2:
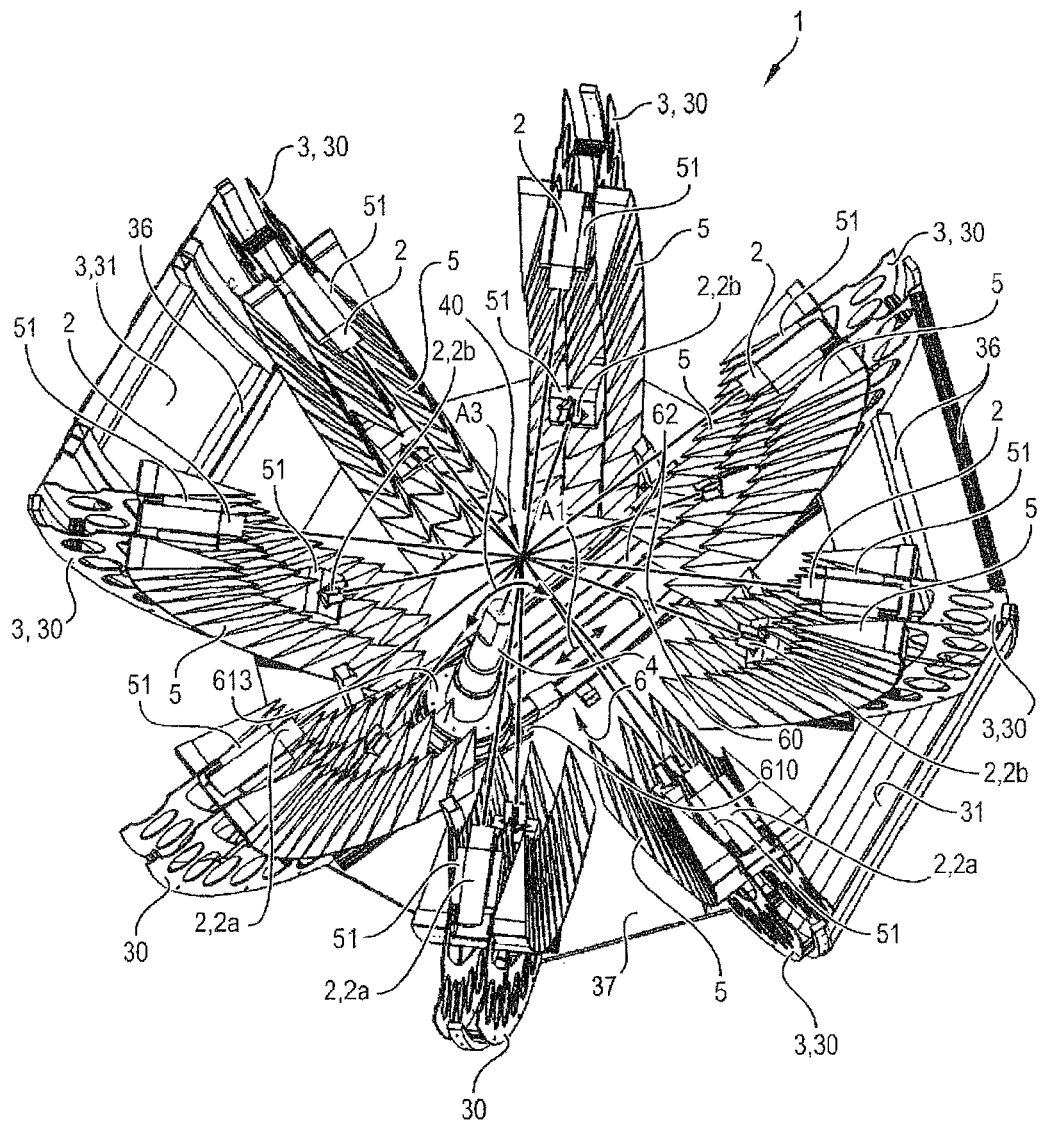
Figure 3:
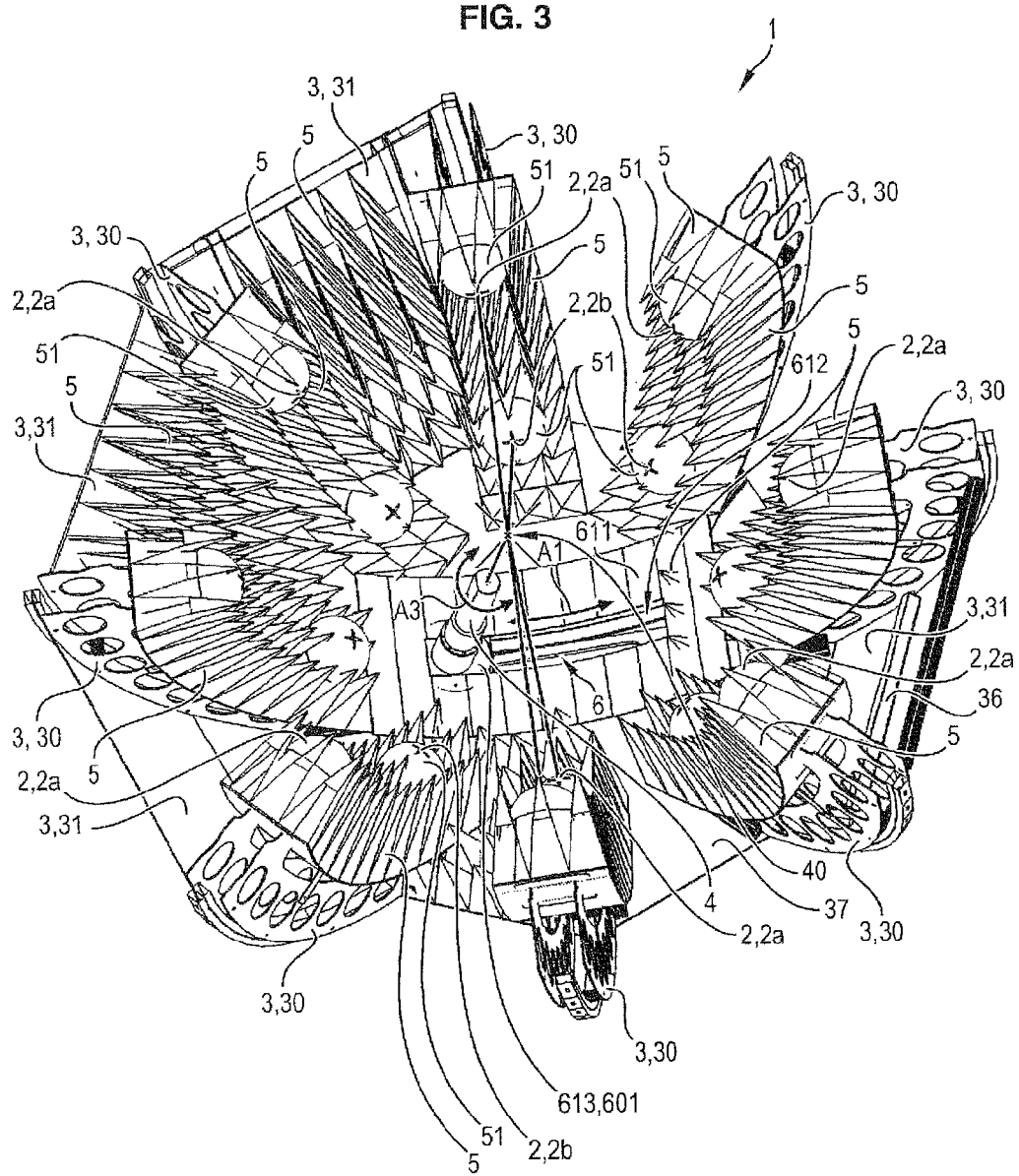
Figure 4:
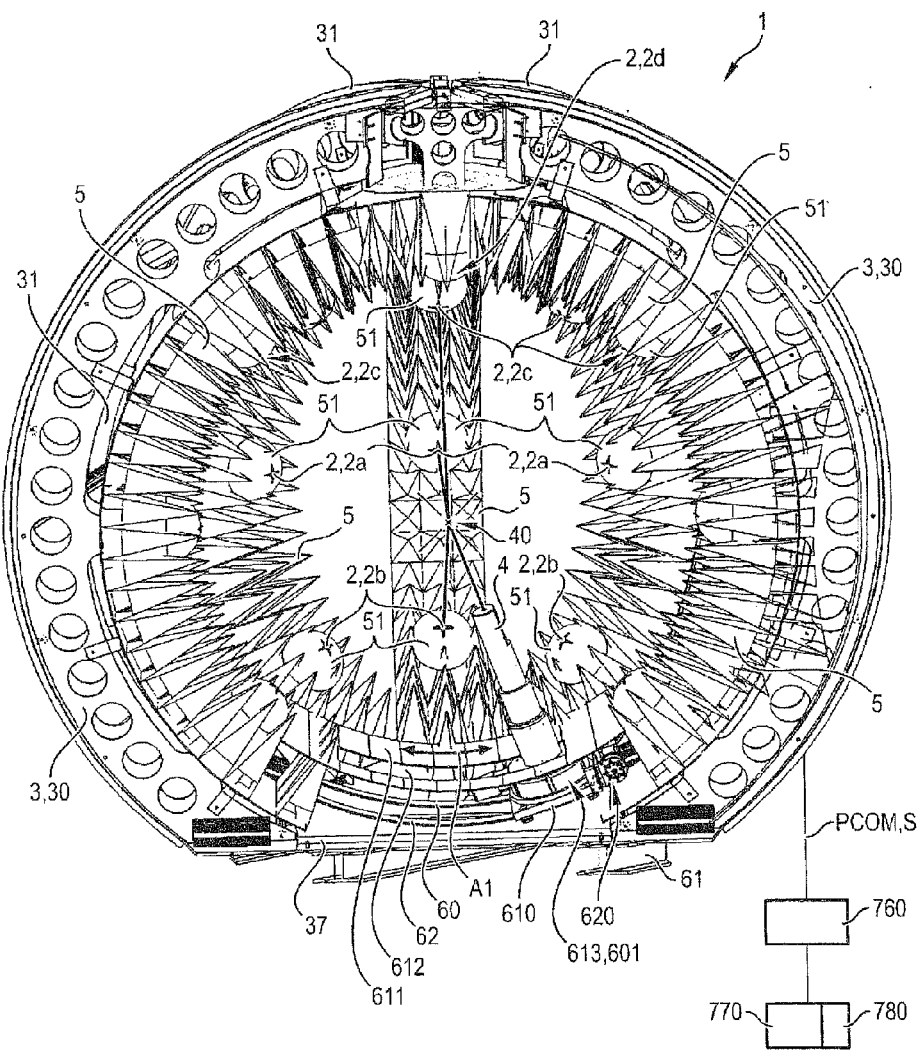
Figure 5:
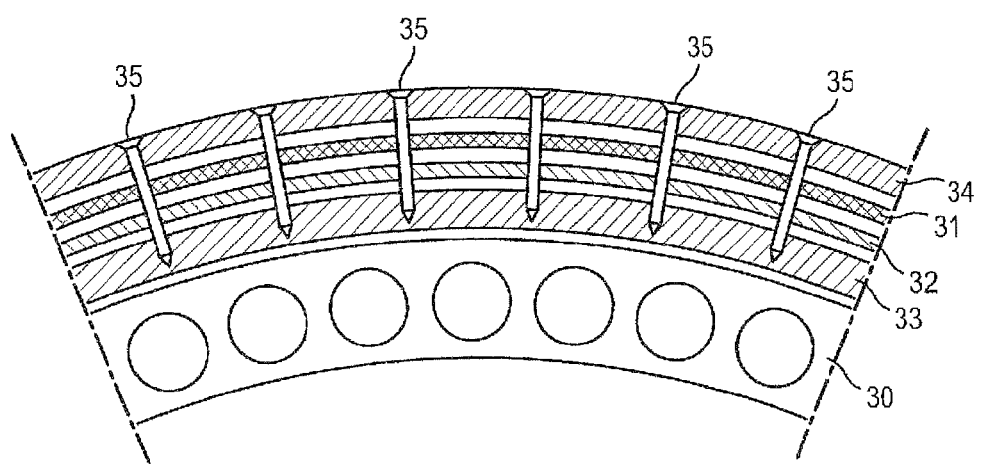
Figure 8:
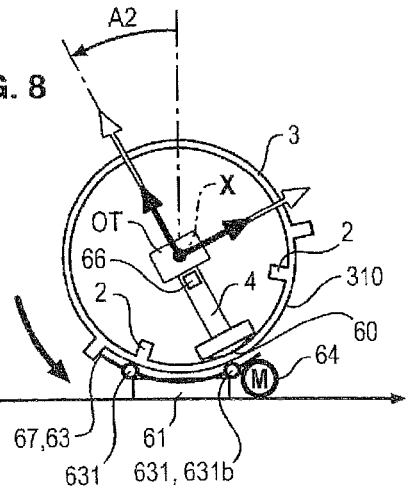
Figure 9:
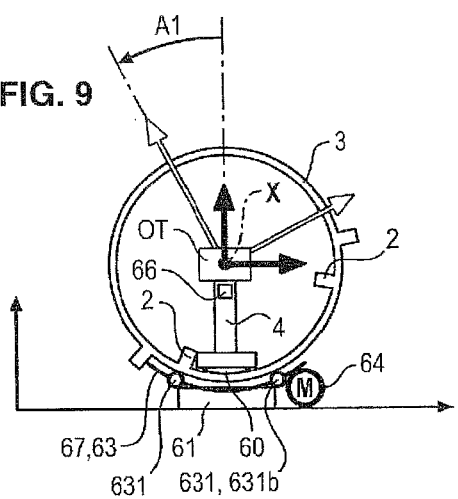
Figure 10:
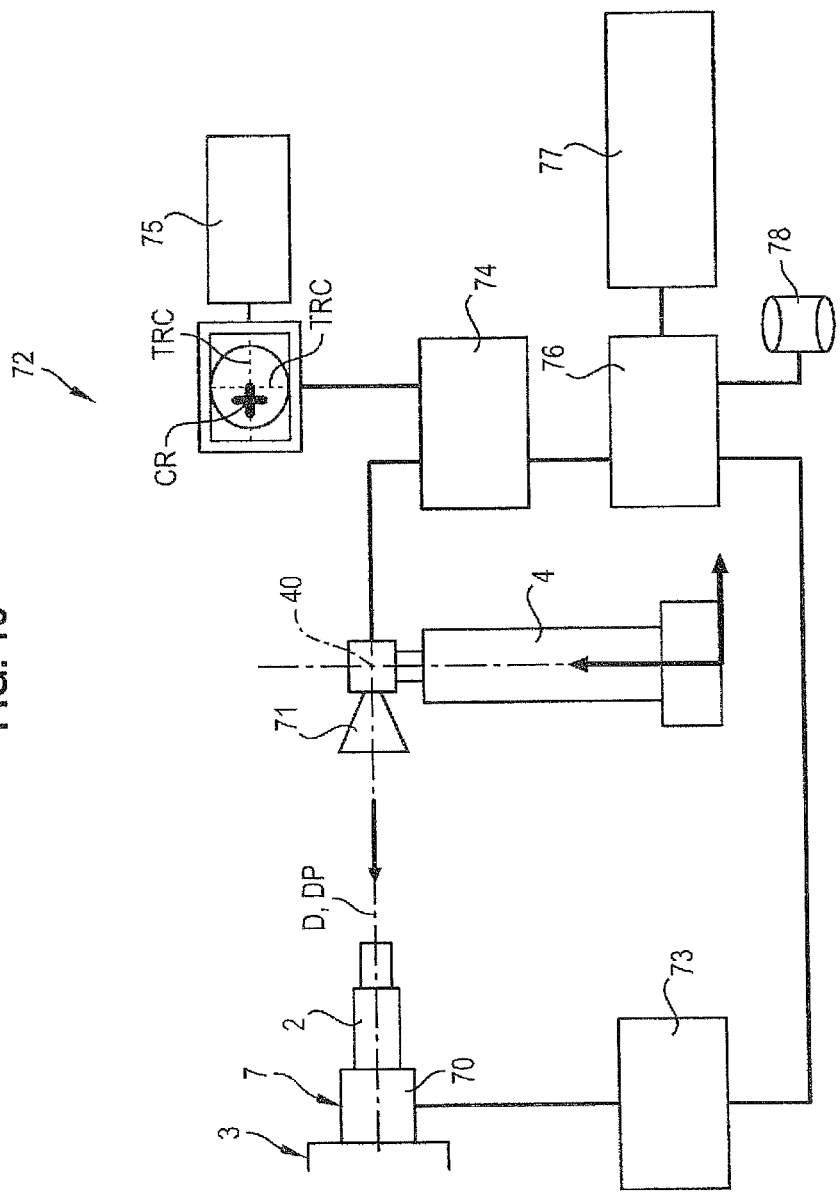
Figure 15:
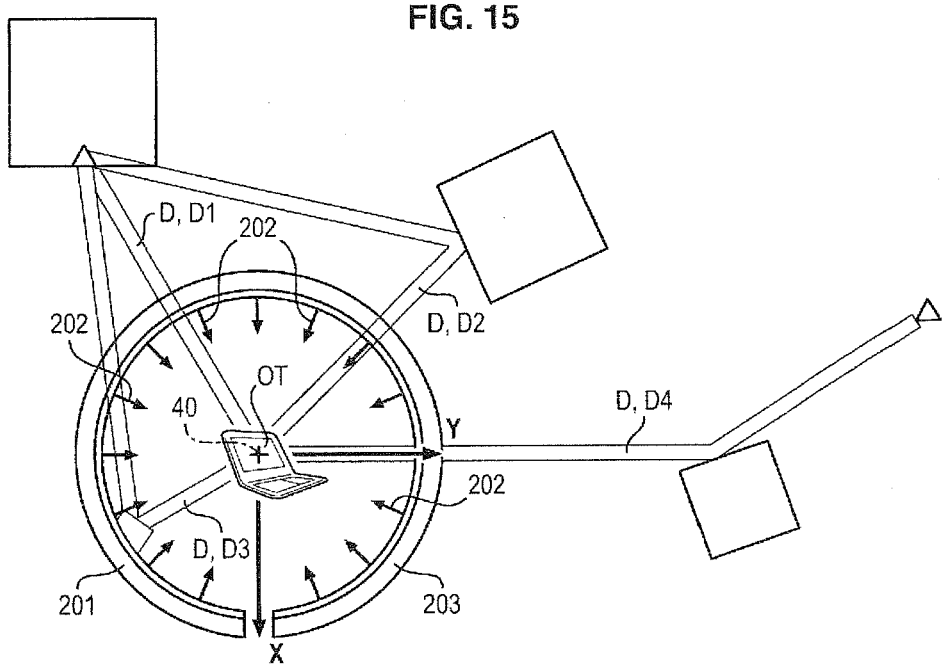
Figure 16:
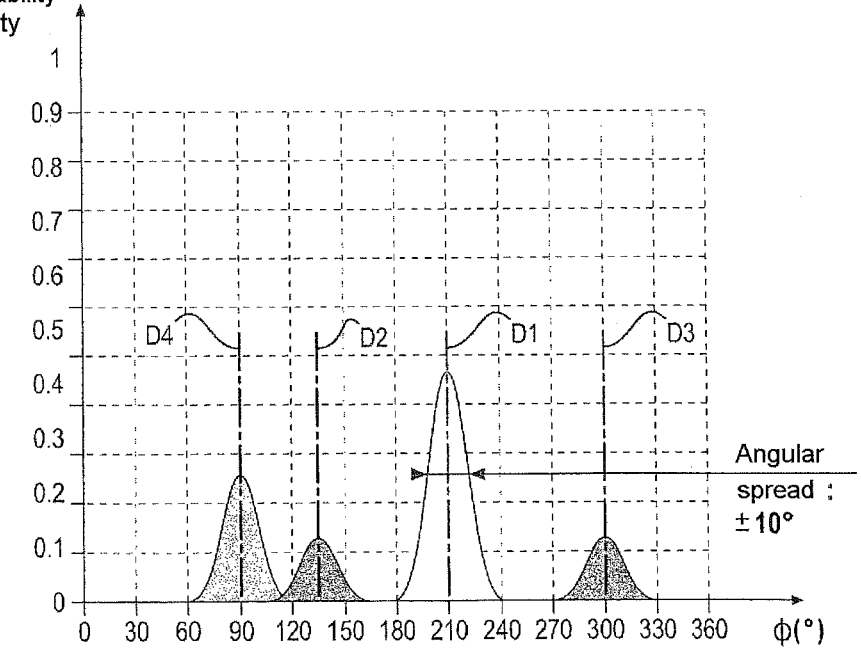
Figure 17:
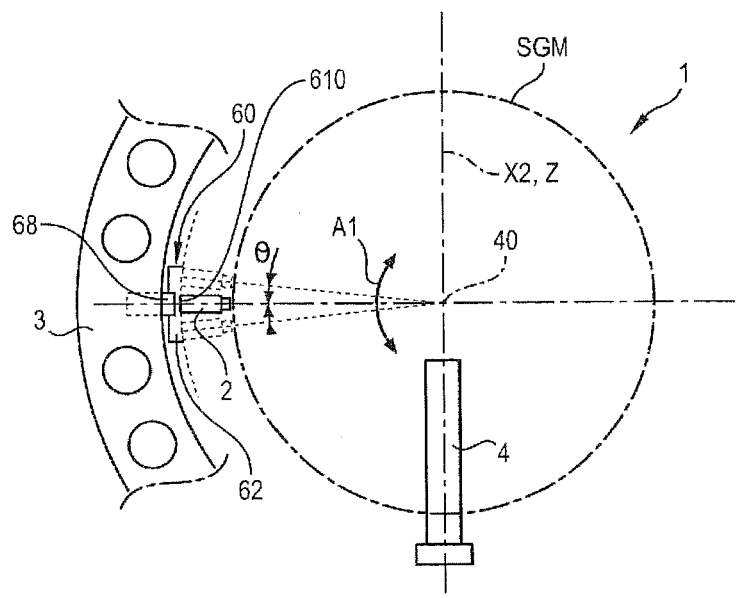
Figure 18:
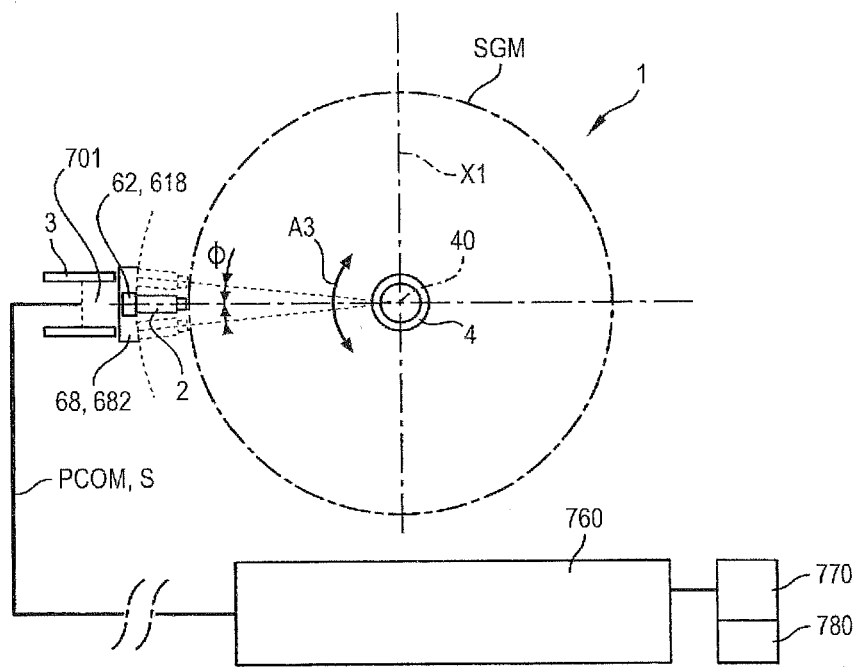

The invention will be more clearly understood from the following description given solely by way of non-limiting example in reference to the diagrams in which:

FIG. 1 is a schematic side view of an embodiment of the test device according to the invention, FIG. 2 is a schematic plan view in perspective of the interior of the test device according to an embodiment of the invention, FIG. 3 is another schematic plan view in perspective of the interior of the test device according to an embodiment of the invention, also showing the bottom of the support structure of the probes, FIG. 4 is an open frontal schematic view of the test device according to an embodiment of the invention, FIG. 5 is a schematic view in transversal section of part of the device according to an embodiment of the invention, FIGS. 6 to 9 are open frontal schematic views of the test device according to an embodiment of the invention in different sliding positions, FIG. 10 is a block diagram of an alignment device of a probe according to the invention, FIGS. 11 to 16 represent examples of electromagnetic scenarios which can be reproduced by the device according to the invention generating an angular spread in two or three dimensions, FIG. 17 is a side view of the test device according to another embodiment of the invention, and FIG. 18 is a plan view of the test device according to FIG. 17, FIG. 19 is a digital example of angular spread as a function of time.

The invention is described hereinbelow first in reference to FIGS. 1 to 16 in an embodiment in which said at least one probe is one or more of a network of a plurality of probes 2 supported by a support structure 3, each probe having a separate principal aiming direction D towards the test point 40, and in which the mechanical displacement device 6 makes the support structure of the probes and the support 4 for the object OT being tested undergo a determined relative movement relative to each other to generate by said at least one probe 2 the movement representative of the predetermined angular spread statistic relative to its principal aiming direction D. The principal aiming direction D is supposedly fixed for each probe 2. Each probe 2 is for example a radiofrequency probe.

In the embodiment illustrated in FIGS. 1 to 9, the device 1 for electromagnetic testing comprises a network of electromagnetic probes 2 fixed to a support structure 3. The support structure 3 comprises for this purpose support uprights 30 for supporting of the probes 2, these uprights 30 being for example in the form of arches extending vertically and being for example conductive.

The device 1 also comprises a support 4 for supporting one or more objects being tested, this support 4 being for example formed by a mast.

The support structure 3 comprises at least one wall 31 extending, according to the three dimensions of the space around the support 4 for the object being tested, to form a Faraday cage fully closed around the object being tested when the latter is on the support 4. The object being tested is for example a radiating object, as indicated hereinabove. This prevents external electromagnetic radiation from penetrating inside the closed space delimited by the support structure 3. This also prevents the electromagnetic radiations emitted by the probes 2 and/or the electromagnetic radiations emitted by the object being tested arranged on the support 4 from leaving the closed space delimited by the support structure 3. In FIGS. 1 to 4, the device for electromagnetic testing is illustrated with parts of the wall 31 of the support structure removed to show the interior of the latter.

The wall 31 or the walls 31 is or are fixed to the uprights 30 to prevent any electromagnetic leak towards the interior or the exterior, for example by the fastening mode illustrated in FIG. 5, which will be described in more detail hereinbelow.

On its inner side turned towards the object being tested and the support 4, the support structure 3 comprises anechoic electromagnetic absorbers 5 located in the intervals between the probes 2. Consequently, when the uprights 30 as illustrated are inside relative to the wall 31, they are covered by anechoic electromagnetic absorbers 5 turned towards the target point 40 of the probes 2, this target point 40 in general being above or near the support 4 and the object being tested in general having to be centred at this test point 40. The wall 31 is covered on its inner side with anechoic electromagnetic absorbers 5 turned towards the target point 40 at which the object being tested on the support 4 generally must be centred. The electromagnetic absorbers 5 are for example pyramidal, as illustrated. Some of them can for example be flat, especially to cover the base 611 of the system of relative displacement 6. The absorbers 5 prevent the electromagnetic radiation emitted by the probes 2 and/or the electromagnetic radiation emitted by the object being tested from reaching the wall or walls 31 and the uprights 30 or attenuate the latter strongly, to prevent or sharply decrease the reflections which might be caused by the uprights 30 and the wall or the walls 31. In fact, the uprights 30 are for example metallic, especially made of steel or aluminium. The wall or the walls 31 are conductive and made of metal or other conductive material to form an electric wall. They are for example each formed from aluminium sheet. The electromagnetic absorbers 5 are arranged over the entire inner surface of the structure 3 with the exception of the probes 2, which are coated in specific electromagnetic absorbers 51 for example of flat form as in FIG. 2, or else shaped as in FIGS. 3 and 4, the absorbers 5 therefore being around and between the probes 2 fitted with their specific absorbers 51.

The walls 31 are for example curved by being oriented towards the support 4. A plurality of walls 31 is for example provided, with each of the walls 31 fixed between two successive uprights 30. In FIGS. 1 to 4, the uprights 30 are for example in the form of semi-circular arches, extending along a meridian of a sphere to give the support structure 3 a general spherical form. As illustrated, the wall or the walls 31 forming a Faraday cage can be curved in the vertical direction only, that is, each formed from a portion of a cylinder having its geometric axis being horizontal. The wall or the walls 31 forming a Faraday cage can also be of general spherical form. Or the wall or the walls 31 forming a Faraday cage can also be facetted. In addition, a door is provided in one of the walls 31 for allowing a person to enter the structure 3 to take in and/or remove the object being tested on the support 4.

In the embodiment of FIG. 5, a wall 31 is fixed on the outer side of an upright 30. A radiofrequency joint 32 (also called RF joint) is provided between the upright 30 and the wall 31 to ensure sealing vis-à-vis electromagnetic radiations between the interior and the exterior. Such RF joints 32 are for example formed by a metal ribbon, for example constituted by knitted metallic wires. Such a joint 32 enables to de adapted to curved or facetted forms.

In addition, a first conductive metal hoop 33 is fixed to the outer side of the upright 30, the RF joint 32 being between the first hoop 33 and the wall 31. A second conductive metal hoop 34 is provided on the outer side of the wall 31 facing the RF joint 32, the wall 31 therefore being between the second hoop 34 and the RF joint 32. The first hoop 33, the RF joint 32, the wall 31 and the second hoop 34 are fixed to each other by screws 35 passing through them from the exterior. Of course, any other fastening means 35 could be provided. These fastening means 35, by bringing the second hoop 34 closer to the first hoop 33, enable to compress the RF joint 32 to ensure continuity of the electromagnetic shielding, as well as to fix the wall 31 to the upright 30.

As shown in FIGS. 2 and 3, cross members 36 can also be provided between the uprights 30 and behind the absorbers 5 between the latter and the wall 31 to stiffen the support structure. Also, the electromagnetic sealing principle described in the example of FIG. 5 can be used again to connect the walls 31 by means of these cross members 36 from the electromagnetic shielding viewpoint in the event where the walls 31 are constituted by several pieces in the direction of the meridian.

The circular geometry of the uprights 30 in the embodiment illustrated in FIGS. 1 to 5 enables to place the probes 2 uniformly around the support 4 and around its target point 40 in spherical geometry. For example, the angular azimuthal distance between the uprights 30 in the form of circular arches is the same for all the uprights 30. In the same manner, the angular distance between the probes 2, located on the same upright 30, relative to the horizontal axis passing through the target point 40 and perpendicular to the plane of the upright 30 is for example the same for all the probes 2. Therefore, if the uprights 30 represent the meridians of a sphere, it is for example provided a first set of n probes 2, called 2a, located on a same equatorial plane passing through the target point 40, a second set of n probes 2, referenced 2b, located in a second plane parallel to the first equatorial plane and arranged at a second negative angle of latitude relative to the first set of probes 2a, a third set of n probes 2, called 2c, located on a third plane parallel to the first equatorial plane and shifted by a third angle of latitude relative to this equatorial plane, this third angle having the same absolute value as the second angle but being in the opposite direction, as well as another probe 2, 2d, located at the apex of the sphere, that is, at the upper point of intersection of the uprights 30, forming the north pole of the sphere. The probes 2 are at an equiangular distance in each of the first, second and third planes indicated hereinabove. The second angle and the third angle are for example equal to 45° in absolute value, with the same for the angles of longitude between the meridians formed by the uprights 30. In the embodiment illustrated in FIG. 2, this angle is for example identical in longitude and in latitude, by being for example equal to 45°. In this particular embodiment the probes are distributed over m meridians and p=m/2−1 planes of latitude, with a probe optionally present at the apex of the structure 3.

In the embodiment illustrated in FIGS. 2 to 4, the support 4 is inside the closed volume defined by the support structure 3.

In the embodiment illustrated in FIGS. 1 to 9, the displacement system 6 for displacing the support structure 3 for supporting of the probes 2 and the support 4 for supporting of the object being tested relative to each other is provided inside the closed volume defined by this support structure 3 and the walls 31. This displacement system 6 enables to move the support structure 3 and the support 4 relative to each other according to at least one degree of liberty, and for example according to at least two degrees of liberty, such as for example according to at least one angular displacement about a geometric axis passing through the target point 40, which can comprise for example an angular displacement A1 in a first non-horizontal and for example vertical plane, passing through the target point 40 and secant of the first and/or another angular displacement around the vertical geometric axis passing through the target point 40. In the embodiment illustrated in FIGS. 2 to 4, the system 6 comprises means for effecting a first relative angular displacement of the support structure 3 for supporting of the probes 2 and of the support 4 relative to each other according to a first sliding angle A1 in a non-horizontal and for example vertical plane (sliding displacement) and effecting the other relative angular rotation displacement A3 according to another angle of rotation around the vertical geometric axis passing through the target point 40, which enables to have all the possible relative dispositions of the probes 2 relative to the support 4 and to the target point 40, and accordingly to carry out spatial oversampling by means of the network of probes 2 during measuring of the electromagnetic field. This relative displacement system 6 is, for example, as according to document WO 2010/006891.

This system 6 comprises a first relative angular displacement system 60 for displacing of the support structure 3 and of the support 4 relative to each other according to the first sliding angle A1. This first angular displacement system 60 comprises for example a guide rail 62 in an arc of a circle fixed to a lower and inner part of the support structure 3, wherein the rail 62 and the pallet 610 supported by this rail 62 are therefore located inside the closed volume defined by the support structure 3, the walls 31 and the lower part. The pallet 610 can be displaced angularly according to the first sliding angle A1 on the rail 62, means 620 being provided to shift the pallet 610 on the rail 62. Another system 601 of relative displacement for displacing of the support 4 for the object being tested and of the support structure 3 in rotation relative to each other about a vertical axis is provided, for example by the fact that the support 4 is mounted on the pallet 610 by way of rotation means 613 which allow the support 4 to turn relative to the pallet 610 angularly according to the angle of rotation A3. These rotation means 613 allow the structure 3 and the support 4 to turn relative to each other. FIGS. 3 and 4 show the cover plate 611 of the system 6, which is also covered by absorbers 5 and comprises a passage 612 for displacement of the support 4 in the latter, a lower conductive wall 37 forming a Faraday cage being provided under the displacement system 6. The relative displacement system 6 for displacing of the support structure 3 and of the support 4 for the object being tested relative to each other is therefore fully included inside the "integrated Faradisation" of the measuring system, which avoids for example any opening in the lower wall 37 and therefore any rupture of the Faradisation to pass the support 4 through. The system 6 is covered by electromagnetic absorbers 5, 51 by means of the cover plate 611 and therefore allows continuity of the "integrated anechoisation" of the measuring system, which for example avoids any rupture of the covering of absorbents and therefore any parasite reflection and/or diffraction.

The mechanical displacement device for displacing of the at least one probe and of the object being tested relative to each other to make the at least one probe undergo a relative movement representative of a predetermined angular spread statistic relative to the principal aiming direction D to generate electromagnetic radiation having this predetermined angular spread statistic relative to the aiming direction by the at least one probe is for example formed by the displacement system 6 to make the probe undergo the first relative sliding angle A1 in a vertical plane and the second relative angle of rotation A3 about a vertical axis. The predetermined angular spread statistic can be an angle in one dimension (angle in a plane) or two dimensions (solid angle). The test point is illustrated by the target point 40 where the object being tested must be located and which represents an aiming direction of each probe 2 towards the test point 40. A computer is provided for sending, via an appropriate interface for output of electrical control signals, commands of angular displacement according to the first and/or second angle to an actuator of the mechanical displacement device, these commands corresponding in real time to the predetermined angular spread statistic, able to be selected in advance on the computer by an appropriate interface. As a consequence, the system 6 moves the support 3 for the probes 2 and the object being tested placed at the target point 40 relative to each other by a first and/or second angle corresponding to the predetermined angular spread statistic.

Of course, only the first relative angular displacement system 60 for displacing of the support structure could form this mechanical displacement device to make the probe undergo only the first relative sliding angle in a vertical plane or only the second displacement system 601 for displacing of the support 4 of the object being tested and of the support structure 3 in rotation relative to each other around the vertical axis is provided to make the probe undergo only the second relative angle of rotation around the vertical axis.

For example, in an embodiment, the support structure 3 is fixed and it is the support 4 which is moved by the system 6, 60, 601 of relative displacement relative to the support structure 3.

For example, in another embodiment, the support 4 is fixed and it is the support structure 3 which is displaced by the system 6, 60, 601 of relative displacement relative to the support 4.

For example, in another embodiment, relative to a fixed reference point, the support structure 3 is displaced according to one of the angles A1 and A3 by the relative displacement system 6, 60, 601 and relative to this same fixed reference point the support 4 is moved by the relative displacement system 6, 60, 601 according to the other of the angles A1 and A3.

Of course, a single probe 2 on a support structure 3 other than that described hereinabove could be provided.

Also, in the above, the support structure 3 can be other than that described hereinabove.

In an embodiment of the invention, another second relative displacement system 63 for displacing of the support structure 3 relative to the base 61 is provided, between a lower base 61 intended to be placed on the ground and the support structure 3, inside which is fixed the first relative displacement system 6 for displacing of the support structure 3 relative to the support 4 for the object being tested. This second angular displacement system 63 is similar to the first angular displacement system 60 in order to be able to move the support structure 3 relative to the base 61 angularly in the same first vertical plane, but by the second sliding angle A2 opposite the first sliding angle A1 (the second angle A2 has the same absolute angle value as the first angle A1 but is of opposite direction to the first angle A1), so that the support 4 remains substantially in a prescribed vertical position to compensate in real time the pivoting of the support 4 and to do away with the effects of gravity on this support 4. The second sliding angle A2 and the first sliding angle A1 are around the same geometric axis X, which is an axis passing through the target point 40 and is for example horizontal.

In the first vertical plane FIGS. 6 to 9 illustrate an embodiment of the second relative displacement system 63 for displacing of the support structure 3 relative to the base 61. This system 63 comprises several rollers 631 for support, guide and rolling of the outer surface 310 of the walls 31 of the support structure 3, this outer surface 310 being curved and spherical, for example. One or more 631*b* of the rollers 631 is driven in rotation by a motor 64 to make roll the outer surface 310 relative to the base 61 by the second angle A2. The rollers 631 are carried by a chassis 67 allowing passage of the outer surface 310 between the rollers 631, this chassis 67 having for example a curved and concave surface towards the surface 310, this chassis 67 being for example a cradle or being called rolling sled and being formed by a portion of a sphere. Of course, several rollers 631 can be provided, directed parallel to the axis about which the angular displacements A1 and A2 are made, but also several other rollers parallel to one or more other directions, to limit the course of the surface 310 on the chassis 67.

An operating example of the systems 6 and 63 is described hereinbelow in a decomposed and fictitious manner in reference to FIGS. 7 and 8, moving from the position of FIG. 6 to the position of FIG. 9.

Figure 6:
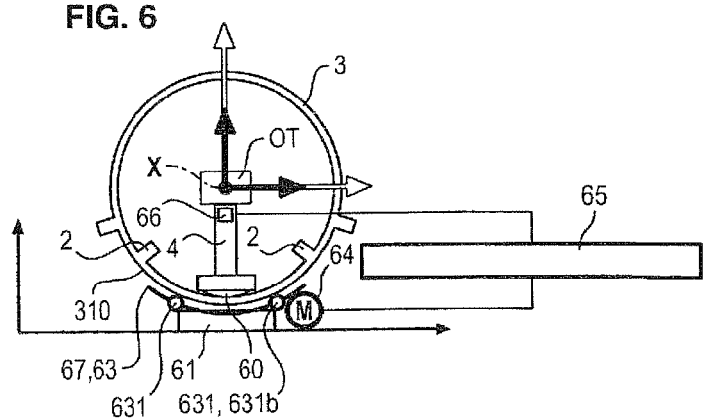
Figure 7:
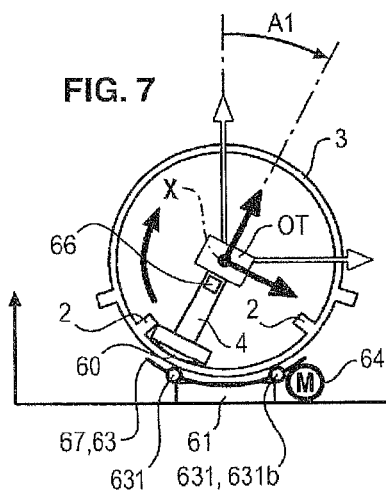

Using a control element the user controls the angular displacement of the first system 60 to shift the support structure 3 for supporting of the probes 2 and the support 4 for the object being tested OT relative to each other by the first determined sliding angle A1 around the first geometric axis X, as in FIG. 7. FIG. 7 illustrates the goniometric movement A1 of the support 4 relative to the structure 3, the angles A1 and A2 being initially supposed as zero in FIG. 6.

Provided on the support 4 for the object being tested OT is a sensor 66 for measuring the real angle of inclination of the support 4 relative to the vertical. In the position illustrated in FIG. 6, this sensor 66 therefore measures a real angle of inclination being zero relative to the vertical. In the fictitious position illustrated in FIG. 7, this sensor 66 therefore measures a real angle of inclination A1 relative to the vertical.

The motor 64 and the sensor 66 are connected to a feedback loop 65 to control the drive motor 64 as a function of the real angle of inclination of the support 4 relative to the vertical, measured instantaneously by the sensor 66.

The loop 65 has a corrector having as setpoint a measured angle of the sensor 66 of zero corresponding to the prescribed position of the support 4. The corrector acts on the command of the motor 64 to correct the real angle measured by the sensor 66 and to make it equal to this setpoint.

In the fictitious position of FIG. 8, by means of the roller 631*b* driven by the motor 64, this feedback loop 65 turns the surface 310 and the support structure 3 for the probes 2 by an angle A2 equal to the opposite to the real angle A1 of inclination measured by the sensor 66, around the geometric axis X relative to the fixed base 61 and to the fixed chassis 67. FIG. 8 illustrates the reverse rotation A2 of the surface 310 of the support structure 3 for the probes 2 relative to the base 61.

In FIG. 9, the combination of the goniometric movement A1 of FIG. 7 and of the reverse rotation A2 of FIG. 8 moves the support 4 for the object OT back into the prescribed position of FIG. 6 relative to the vertical, prescribed position so-called at the vertical, in which the mast 4 is deemed to be positioned at the vertical.

The goniometric movement A1 of FIG. 7 and the reverse rotation A2 of FIG. 8 are simultaneous and synchronised by the feedback loop 65 in position. The verticality of the mast 4 is ensured permanently. So as soon as the first system 60 goes to angularly move the support 4 around the axis X, the loop 65 causes angular displacement of the support structure 3 for the probes 2 in the reverse direction to keep the support 4 vertical. FIGS. 7 and 8 are fictitious in that goniometric movement and reverse rotation are made by small successive steps which do not incline the support 4 as it is illustrated. Finally, only in FIG. 9 is the support structure 3 for the probes 2 illustrated which has turned by the first angle A1 relative to the support 4, the latter remaining in the same position at the vertical throughout the movement.

In effect, the rocking of the support 4 relative to the vertical would cause flexion of the latter on its height separating the target point 40, where the object being tested, must be arranged, and the support structure 3, which would falsify the positioning of the target point 40. In fact, a high level of precision is required on the positioning of the target point 40 relative to the theoretical aiming point of intersection of the probes 2. The target point 40 where the object being tested is arranged must be at this theoretical aiming point of intersection of the probes 2 or be very close to this theoretical aiming point of intersection of the probes 2. For example, for a frequency of 6 GHz of operation of the probes, the target point 40 must be in a theoretical cube of 1.5 mm per side around this theoretical aiming point of intersection of the probes 2. For probes operating at 18 GHz, the target point 40 must be in a theoretical cube of 500 μm per side around this theoretical aiming point of intersection of the probes 2. Consequently, the flexion of the support 4 which is caused by its inclination relative to the vertical risks taking the target point out of these positioning tolerances. Thanks to the two complementary angular positioning systems mentioned hereinabove, specifically the first angular positioning system 60 for the support 4 located inside the support structure 3 and the second positioning angular system 63 arranged between the support structure 3 and the base 61 fixed to the ground, the support 4 is kept in a prescribed vertical position and it is the support structure 3 which moves angularly relative to the base 61 and to the support 4 for the object being tested. This double system is called antigravitational. This double system enables heavier objects to be placed on the support 4, which therefore do not risk flexing the support 4, or even damaging the support 4, or even falling due to excess inclination and compromising the precision of measurements, or even the feasibility of measurements quite simply. Also, this antigravitational system allows for example having greater angular spacing between probes 2 and therefore reduces the number of probes 2 since the travel of the goniometric movement of the system 6 is no longer limited in amplitude by the constraints of flexion and torsion of the support 4. This so-called antigravitational system enables to carry out angular spreads on increased angular openings by doing away with mechanical constraints in flexion exerted by the object being tested during pivoting of the support 4.

FIGS. 11 to 16 illustrate examples of angular spread.

Figure 11:
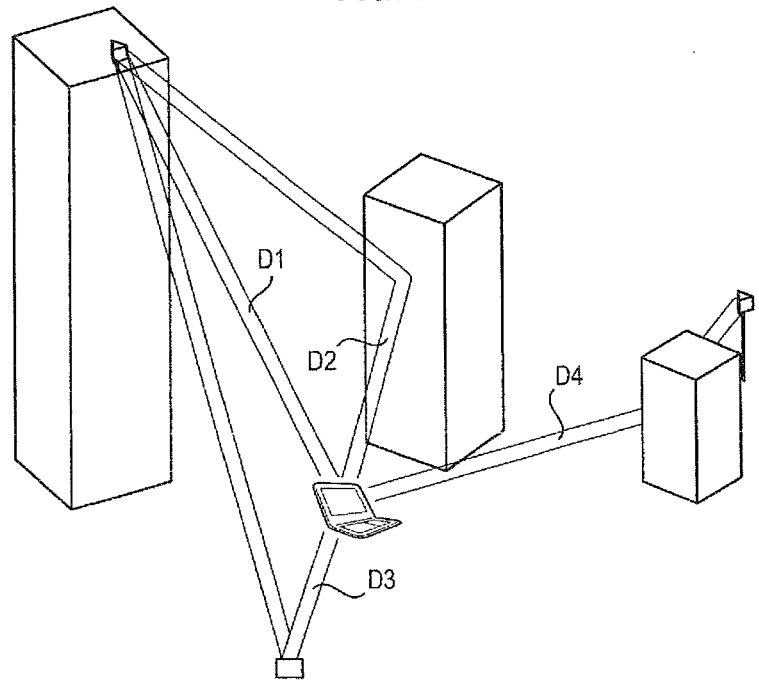

In FIG. 11, in a propagation channel, the signal arrives from several directions: the principal direction D1 corresponding to the 'base station—mobile' direction as well as from secondary directions D2, D3 created by the reflection of the principal signal on buildings and obstacles. There can also be interference signals D4 coming from other unwanted radiation sources. All these directions D1, D2, D3, D4 constitute what is known as arrival directions, materialised by the 'spots' in FIG. 11 which represents a given propagation scenario.

Figure 12:
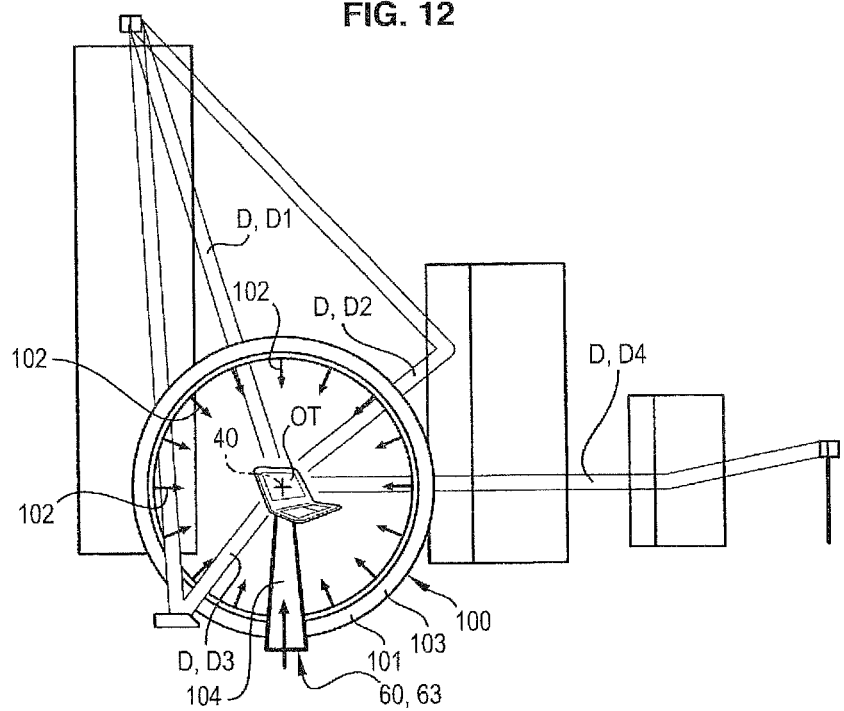

FIG. 12 is a reproduction of the arrival directions of FIG. 11 in the plane of the elevations. If a vertical section is made of the scenario illustrated in FIG. 11, the receiving antenna OT sees the direct and indirect trajectories D1, D2, D3 and D4 projected in the vertical plane arrive according to 4 different angles of elevation. This section of the propagation scenario can be reproduced by means of an electromagnetic test device formed by a vertical measuring arch 101, in which the probes 102 are distributed in a vertical plane, on a support structure 103 in the form of an arch or ring, a support 104 for the object OT being tested being provided. The first angular displacement system 60 according to the first sliding angle A1 in the plane of the arch around the target point 40 where the object OT being tested on the support 4 is provided, is provided to move the support structure 103 for the probes 102 and the support 104 of the object being tested relative to each other, the second angular displacement system 63 and the elements similar to those described above being provided for example with a similar operation.

Figure 13:
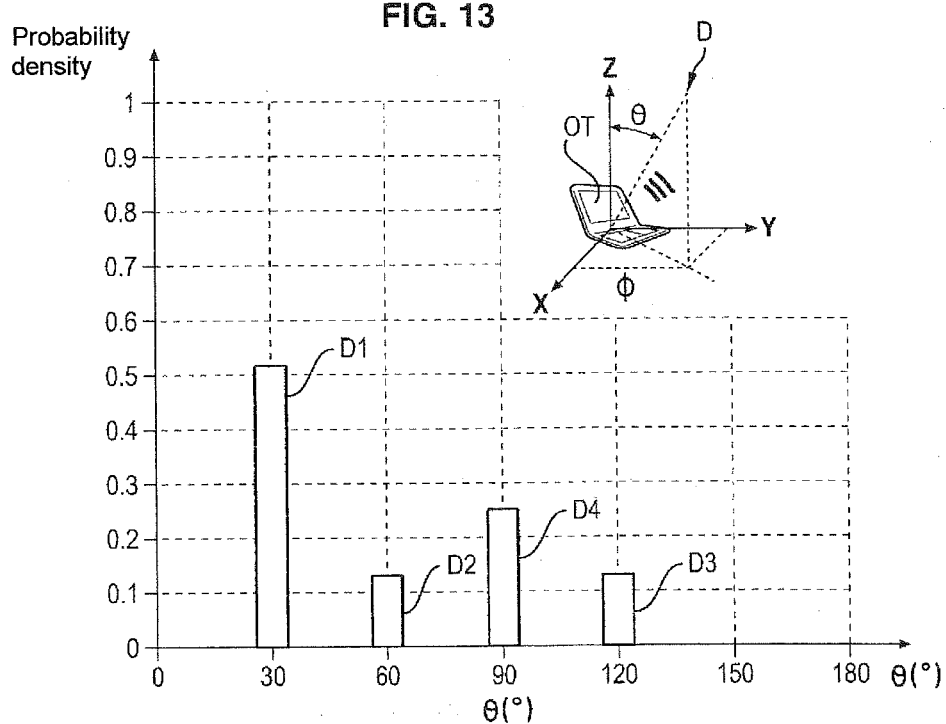

Assuming that in FIG. 13 the support structure 103 and the support 104 are fixed, the object being tested sees the energy brought by each trajectory arrive from different directions D1, D2, D3 and D4 according to the angles of elevation, designated generally by the reference D. In FIG. 13, these arrival directions D1, D2, D3 and D4 are materialised by bars whereof the height is proportional to the energy which they transport, as a function of their angle of elevation θ. This FIG. 13 corresponds to the probability density of the power received by the object being tested as a function of the angle of elevation.

But, in the real environment, other arrival directions coexist near these principal directions D1, D2, D3 and D4. Because of this, in the real environment, the mobile sees the signal arrive only from the principal direction, but also from other directions spread around the latter. This spread is described due to a law of probability density, that is, the probability that the energy will arrive from a given direction of space. The spread follows a well-defined mathematical law whereof the parameters are the principal angle of arrival D and the angular spread, the angular spread corresponding by definition to the angular opening at which half of the energy transported by the principal direction of arrival is received.

Figure 14:
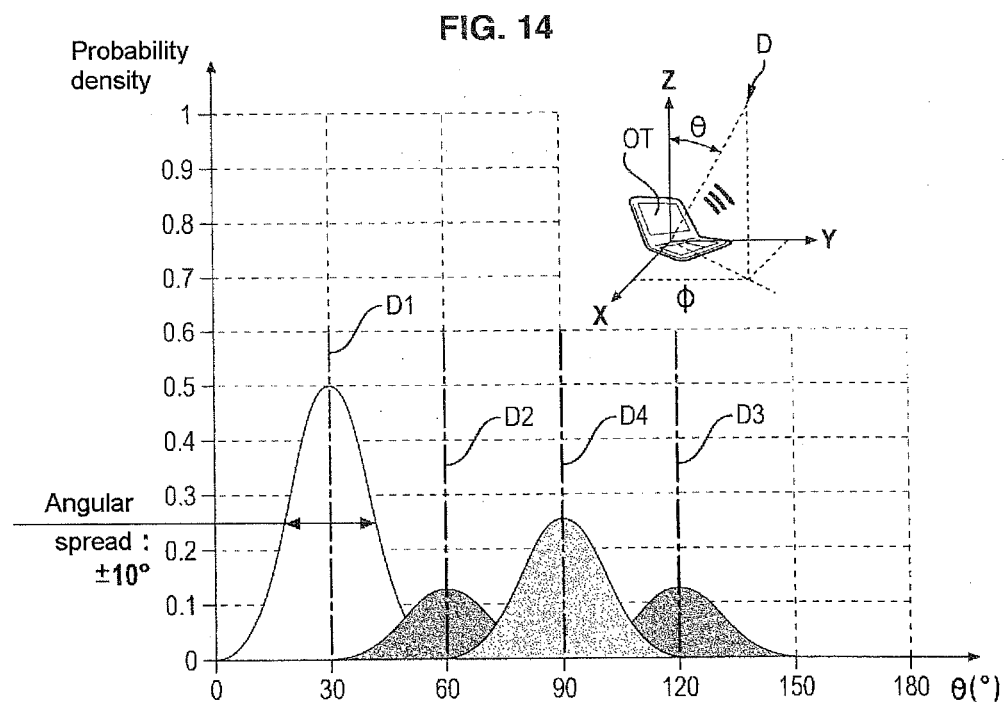

The support structure 103 for the probes 102 and the support 104 for the object OT being tested are displaced relative to each other by actuating the first angular displacement system 60 (goniometric movement) according to the first sliding angle A1 according to the angles of elevation θ, for example so that the incident energy around each direction D seen by the object OT being tested on the support 104 follows a Gaussian distribution for example as a function of the angle of elevation θ. FIG. 14 is by way of example a representation of the incident energy seen by the object OT being tested in elevation around each direction D according to this Gaussian distribution when the goniometer 60 is actuated which generates a flutter of ±10° around the central position of each principal direction D1, D2, D3 and D4 of arrival. It is evident that a spread of the incident energy around the directions D1, D2, D3 and D4 of arrival in elevation has been generated. In a general manner, the value of angular travel can be selected as non zero and less than the space between two consecutive probes to create the preferred angular opening.

Reproduction of the directions of arrival in azimuth is described hereinbelow in FIG. 15.

FIG. 15 is a horizontal section of the scenario illustrated in FIG. 11; the receiving antenna OT sees the projections on the horizontal plane of the direct and indirect paths D1, D2, D3 and D4 arrive according to 4 different angles of azimuth.

This section of the propagation scenario can be reproduced using an electromagnetic test device formed by an arch 201 of horizontal measurement, in which the probes 202 are distributed in a horizontal plane on a support structure 203 in the form of an arch or a ring, a support 4 for the object OT being tested being provided. The other displacement system 601 for the support 4 of the object being tested and for the support structure 3 in rotation relative to each other about a vertical axis according to an azimuth angle in the plane of the arch around the target point 40 where the object OT being tested on the support 4 is provided, is provided. For example, it is the support 4 which turns around the vertical axis due to the means described previously.

For example, the angular opening is non zero and less than or equal to 20°.

The support structure 203 for the probes 202 and the support 4 for the object OT being tested are moved relative to each other by actuating the displacement system 601 in rotation according to the azimuth angle Φ, for example so that the incident energy around each principal direction D seen by the object OT being tested on the support 104 follows a Gaussian distribution for example as a function of the azimuth angle Φ. FIG. 16 is by way of example a representation of the incident energy seen by the object OT being tested in azimuth around each principal direction D according to this Gaussian distribution when the rotary device 601 is actuated which generates a flutter of ±10° around the central position of each principal direction D1, D2, D3 and D4 of arrival. It is evident that a spread of the incident energy around the directions of arrival in azimuth has been generated.

By using the device 1 for electromagnetic testing described hereinabove, for example in the form of a sphere in 3D, a combination of angular spread in elevation and in azimuth can be reproduced according to FIGS. 14 and 16 by combining the rocking movement (sliding) of the goniometer 60 and rotation 601 of the support 4. This results in reproduction of an angular spread in three dimensions to represent the propagation channel in 3 dimensions of space.

The angular spreads in 2 dimensions translate only a projection of the principal and spread directions (therefore limited approach), whereas the angular spread in 3 dimensions represents the real propagation channel in 3 dimensions.

The angular spreads are created physically by means of the goniometer (2D vertical, 2D signifying two dimensions), of the roll axis in azimuth (2D horizontal) and of the combination of the two (3D, 3D signifying three dimensions). The dual method consists of using the orientation movements of the probes by leaving the antenna being tested fixed.

Variations in the amplitude and/or of the phase of the measuring probe can also be associated to these mechanical movements to create and refine the desired law of probability (Gaussian, double exponential, etc). For example, the mechanical movements of the goniometer and/or of the axis of azimuth associated to a variation in the amplitude of the illuminating probes are used to create a law of probability of angular spread at the object being tested.

For example, the angular spreads selected about a fixed value are + or −10 degrees (or a mechanical movement amplitude of 20 degrees in all).

There are several ways to produce the angular spread:

By mechanical movements of the goniometer (2D), of the azimuth roll (2D) or of the combination of the two (3D), the measuring probes staying fixed. In this case, the angular spread is common to each principal arrival.

By mechanical orientation of the probe in the plane of elevation (2D), in the azimuth plane (2D) or of the combination of the two (3D), the object being tested staying fixed. In this case, the angular spread can be individualised for each principal arrival.

According to an embodiment of the invention illustrated in FIG. 10, an individual regulating system 7 for regulating of the mechanical alignment of the probes 2 relative to the target point 40 is provided. This alignment-regulating system 7 comprises for example a motorisation 70 of the probe 2 on its support structure 3 according to at least one degree of liberty other than according to the aiming direction DP of the probe 2 towards the target point 40 and for example according to at least two directions at each probe 2, which are perpendicular or secant relative to the aiming direction DP of the probe 2 towards the target point 40. An automatic alignment device 72 is also provided for example, based for example on an optical camera 71, for example of the CCD type. During an installation phase of the measuring system or even a phase preparatory to taking a measurement of electromagnetic radiations, the optical camera 71 is for example positioned precisely at the test point 40 by being fixed on a reference mast 4 and is oriented successively towards each probe 2 to control proper positioning and proper alignment of the probe 2 by the image taken by the camera 71, the probe 2 forming an identifiable trace CR, for example in the form of a cross, on the image taken by the camera 71. In FIG. 10, the system 7 comprises a motorisation block 70 for motorisation of the probe 2 on the support structure 3 according to the three dimensions of space to then move the probe 2 according to these three dimensions relative to the structure 3, in translation and/or in rotation. A multiaxis controller 73 actuates the motorisation block 70 according to its degrees of liberty. The camera 71 is connected to a module 74 for analysis of the image which it supplies for detecting in this image the trace CR of the probe 2, wherein the image of the camera 71 is also able to be for example displayed on a control screen 75. The module 74 for image analysis is connected to a management module 76, which in turn controls the multiaxis controller 73 to feedback control in positions the trace left by the probe 2 in the image of the camera 71 on a predetermined setpoint trace TRC, corresponding to proper alignment of the aiming direction DP on the test point 40, this trace TRC being a software target. The module 76 is therefore programmed to move the probe 2 relative to its support structure 3 by means of the controller 73 and the motorisation block 70 so that the real trace CR of the probe coincides with the setpoint trace TRC. The module 76 is connected to a interface 77 for programmation by the user and to a memory 78 for saving the traces and/or adjustments made for each probe 2. The probe is then held by the motorisation block 70 in the alignment position on the target point 40.

This guarantees that each probe 2 is well aligned on the same target point 40 for later measurements which can be made by the probe 2 and especially for example for subsequently making angular spreads around each principal direction of arrival D.

The optical camera can for example also be coupled to a laser aim of the probes.

According to an embodiment of the invention illustrated in FIGS. 17 and 18, the mechanical displacement device 6, 60 for making the angular spread relative to the principal aiming direction D is provided between the probe 2 and the support structure 3 of the probe 2. This mechanical displacement device 6, 60 enables to displace the probe 2 relative to the support structure 3 according to at least one degree of liberty, and for example according to at least two degrees of liberty, such as for example according to at least one angular displacement about a geometric axis passing through the target point 40, able to comprise for example an angular displacement A1 in a first non-horizontal and for example vertical plane (in elevation θ in FIG. 17), passing through the target point 40 and/or another angular displacement A3 in another horizontal plane (in azimuth Φ in FIG. 18), passing through the target point 40 and secant of the first plane.

The mechanical displacement device 6 is for example of the goniometric double mechanism type around two secant axes X1, X2 and for example orthogonal.

In the embodiment illustrated in FIGS. 17 and 18, the mechanical displacement device 6 comprises a first relative angular displacement system 60 for the probe 2 relative to the support structure 3 according to the first angle A1. This first angular displacement system 60 comprises for example a rail 62 for guiding according to an arc of a circle centred on the target point 40 in the first plane a driven element 610 supporting the probe 2. The element 610 can be moved angularly according to the first angle A1 on the rail 62, drive means comprising for example motorisation being provided to shift the element 610 on the guide rail 62.

The mechanical displacement device 6 comprises a second relative angular displacement system 68 for the probe 2 relative to the support structure 3 according to the second angle A3. This second angular displacement system 68 comprises for example a fixed rail 682 for guiding according to an arc of a circle centred on the target point 40 in the second plane a driven element 618 supporting the rail 62. The element 618 can be moved angularly according to the second angle A3 on the rail 682, drive means comprising for example motorisation being provided to displace the element 618 on the guide rail 682.

The first relative angular displacement system 60 and the second relative angular displacement system 68 displace the probe respectively around two secant geometric axes X1 and X2, passing through the target point 40, which are for example orthogonal and equal respectively to the horizontal axis and to the vertical axis Z. Consequently, the probe can be moved on a geometric measuring sphere SGM relative to the test point 40 and to the object located there being tested.

Of course, instead of in FIGS. 17 and 18, the rail 62 which is mobile according to the angle A3 on the rail 682 fixed to the support structure 3, this could be the rail 682 which is mobile according to the angle A1 on the rail 62 fixed to the support structure 3.

The support structure 3 can be one of the structures 3, 103, 203 described hereinabove.

In FIGS. 17 and 18, an actuator 701 on the support structure 3 generates the angular displacements A1 and A3 of the device 6 under the control of a management module 760 which controls the actuator 701 in θ and Φ.

The module 760 is connected to a programming interface 770 for programmation by the user and to a recording memory 780 for recording of the control positions PCOM of the probe 2.

An operating mode valid for the embodiments described hereinabove is now described hereinbelow. A calculator, for example a computer, which is illustrated by the management module 760, is provided to control the motor or the motors 620, 613, 64, 701 of the mechanical displacement device or devices 6, 60, 601, 63, 68 to move the probe or the probes 2 according to the angular spread statistic. This angular spread statistic is selected in advance by the user on the interface 770 of the computer. Once all the parameters of the angular spread statistic have been selected, these parameters randomly defining the angular spread are recorded in the memory 780 of the computer. The computer calculates different angular positions which can be taken by the probe relative to the principal aiming direction D with a probability for each angular position calculated according to the statistic selected. The computer then picks among the angular positions recorded in memory, and does this randomly respecting this angular spread statistic having been selected, for successive control positions PCOM for controlling of the motor or the motors for the succeeding instants. The successive control positions PCOM are recorded in the memory with their instant of appearance. The at least one motor 620, 613, 64, 701 obeys the successive control positions PCOM which it receives from the computer 760 to take real successive positions equal to the successive control positions PCOM at successive instants, these real positions each corresponding therefore to a real random angle of the at least one probe 2 relative to its aiming direction D, and for example in two or three dimensions. Associated with each control position PCOM for controlling of a real angle of the at least one probe 2 relative to its aiming direction D is a control amplitude (or module) and/or a control phase for controlling of this probe 2, each probe transmitting electromagnetic radiation whereof the amplitude and/or the phase corresponds to this control amplitude and/or phase control. This control amplitude and/or phase control is generally called control signal S for controlling of the at least one probe 2, which is calculated by the computer for the angular spread statistic selected. In fact, for example for an angular spread statistic of Gaussian type the amplitude of the radiation of the probe 2 decreases when its real angle relative to its aiming direction D increases. It is therefore provided to generate by the computer for the at least one probe 2, in association with the movement representative of the angular spread statistic relative to the aiming direction D, a variable control signal S for control of the radiation emitted by this probe 2, calculation means of this control signal S as a function of the angular spread statistic being provided. Radiofrequency measuring and acquisition means are provided for measuring the response of the object being tested to the radiation of the probe or of the probes.

FIG. 19 represents an example of controlled angular displacements PCOM of a probe 2 according to a statistic defined by the computer 760 as a function of the time t in seconds (s). This statistic is mathematically determined by the computer. This angular displacement can be for example θ or Φ, which can be equal or different. The angular displacements PCOM are taken around the principal aiming direction D, forming the origin of the axis of the ordinates. The controlled angular displacements PCOM are real angles taken successively by the probe 2 over time around the principal aiming direction D. The successive real angular displacements PCOM are imposed by successive control positions PCOM imposed and determined by the computer 760. For example, the angular displacements PCOM illustrated in FIG. 19 have a maximal variation of +/−20° around the principal aiming direction D. This is a digital example of the real aiming angle PCOM of the probe 2 as a function of time after a random selection executed by the computer 760 for maximal variation of the angle by +/−20 degrees around the principal direction D. There is for example the same regular time interval between the successive real angular displacements PCOM. In this way, the device according to the invention generates electromagnetic scenarios of angular spread representing the real conditions of the operation of the equipment being tested. The probes 2 enable to send or receive an electromagnetic radiation determined in advance towards or from the object being tested placed at the target point 40 to characterise the response of the object to electromagnetic radiation emitted. Of course, it is possible to send different types of electromagnetic radiation but determined in advance according to laws calculated by a computer to simulate three-dimensional electromagnetic environments. So, the objects which can be tested at the target point 40 can be so-called "passive" objects being tested comprising one or more antennas fed by cables or else they can be so-called "active" objects being tested or even "wireless", that is, objects being tested having their own supply battery, their own integrated receiving and/or transmission system and their own communication protocol.

The invention claimed is:

1. A method for electromagnetic testing of at least one object, a method in which electromagnetic radiation is sent by at least one probe towards a determined test point where the object being tested is located,
wherein
the at least one probe and a support for the object being tested are moved in a controlled manner relative to each other by a mechanical displacement device moving the at least one probe according to an angular displacement following a predetermined angular spread statistic around a determined fixed principal aiming direction passing through the test point, to generate electromagnetic radiation having the predetermined angular spread statistic around the determined fixed principal aiming direction and to reproduce a scenario of angular spread defined for the electromagnetic radiation.

2. The method according to claim 1, wherein said angular displacement is located in a plane.

3. The method according to claim 1, wherein said angular displacement of the at least one probe is in elevation around the determined fixed principal aiming direction in a vertical plane to generate electromagnetic radiation having the predetermined angular spread statistic in elevation by the displacement device and to reproduce a scenario of angular spread defined for the electromagnetic radiation in elevation.

4. The method according to claim 1, wherein said angular displacement is in azimuth around the determined fixed principal aiming direction in a horizontal plane to generate electromagnetic radiation having the predetermined angular spread statistic in azimuth by the displacement device and to reproduce a scenario of angular spread defined for the electromagnetic radiation in azimuth.

5. The method according to claim 1, wherein said angular displacement is three-dimensional to generate electromagnetic radiation having the predetermined angular spread statistic in elevation and in azimuth by the displacement device and to reproduce a scenario of angular spread defined for the electromagnetic radiation in elevation and in azimuth.

6. The method according to claim 1, wherein the mechanical displacement device is also provided between said at least one probe and a support structure for supporting of the at least one probe.

7. The method according to claim 6, wherein the mechanical displacement device comprises at least one angular displacement device of the probe in rotation around the test point according to at least one degree of liberty relative to the support structure.

8. The method according to claim 1, wherein said at least one probe is one or more in a network of a plurality of probes supported by a support structure, each probe having a separate determined fixed principal aiming direction towards the test point.

9. The method according to claim 6, wherein the support structure is in the form of an arch or ring on which the probes are supported in a plane.

10. The method according to claim 6, wherein the support structure is three-dimensional in form on which the probes are supported distributed in three dimensions.

11. The method according to claim 6, wherein the mechanical displacement device allows at least one determined angular sliding displacement of the support structure and of the support for the object being tested relative to each other at least about a non-vertical geometric axis.

12. The method according to claim 6, wherein the mechanical displacement device allows a second angular rotation displacement of the support structure and of the support for the object being tested relative to each other at least about a vertical geometric axis.

13. The method according to claim 11, wherein the support structure rests on a lower base, provided between the base and the support structure is a second angular displacement system for moving the support structure relative to the base by a second angle of the same absolute value opposite the angular sliding displacement of the first mechanical displacement device of the support relative to the support structure, so that the support of the object being tested retains a prescribed and substantially constant position relative to the vertical, the mechanical displacement device for the support relative to the support structure being called a first system of relative displacement.

14. The method according to claim 13, wherein the second angular displacement system comprises a plurality of support rollers for supporting of an outer curved surface of a wall of the support structure on the base and at least one drive motor for driving at least one of the rollers to make said outer curved surface of the wall of the support structure roll relative to the base by said second angle.

15. The method according to claim 14, wherein there is also provided:
a control element for controlling of the angular sliding displacement of the first system of relative displacement,
at least one measuring sensor for measuring of a real angle of the support for the object being tested relative to the vertical,
a feedback loop for controlling of the drive motor as a function of the angle measured by the sensor so that the angle measured by the sensor is equal to a constant value corresponding to said prescribed position of the support relative to the vertical.

16. The method according to claim 1, wherein a plurality of probes is provided distributed equiangularly according to at least one spherical coordinate about the same target point of the probes.

17. The method according to claim 1, wherein provided on the at least one probe is an individual regulation system for regulating of the mechanical alignment of the probe relative to a target point, a target point where the object being tested on the support must be centred.

18. The method according to claim 17, wherein the individual regulation system for regulating of the mechanical alignment of the probe is associated to at least one optical detection camera positioned at the target point for measuring the mechanical alignment of the probe.

19. The method according to claim 17, wherein the individual regulation system for regulating of the mechanical alignment of the probe comprises motorisation of said probe on the support structure for shifting the probe relative to the support structure according to at least one degree of liberty other than according to the determined fixed principal aiming direction of the probe towards the target point.

20. The method according to claim 18, wherein the individual regulation system for regulating of the mechanical alignment of the probe comprises motorisation of said probe on the support structure for shifting the probe relative to the support structure according to at least one degree of liberty other than according to the determined fixed principal aiming direction of the probe towards the target point, an analysis module of the image supplied by the camera is provided to detect in the image the trace of said probe and a feedback module for controlling of the motorisation to align the detected trace of the probe on a setpoint trace corresponding to the alignment of the probe on the target point is provided.

21. The method according to claim 1, wherein the predetermined angular spread statistic is a double exponential law.

22. The method according to claim 1, wherein the predetermined angular spread statistic is a Gaussian centred relative to the determined fixed principal aiming direction and having an angular spread defined by the angular opening centred around the determined fixed principal aiming direction, for which the half of the maximal energy of the radiation is transported.

23. The method according to claim 1, wherein at least one computer comprises an interface allowing a user to select said angular spread statistic, the computer calculates a plurality of successive angular control positions for controlling of the mechanical displacement device relative to the determined fixed principal aiming direction, which appear according to said angular spread statistic having been selected, the computer sends the successive angular control positions having been calculated to at least one motor of the mechanical displacement device so that said at least one probe takes determined real successive positions corresponding to the successive control positions.

24. The method according to claim 23, wherein the computer calculates for each angular control position a control signal for controlling of the intensity and/or of the phase of the electromagnetic radiation emitted by said at least one probe.

25. A device for electromagnetic testing of at least one object for executing the test method according to claim 1, the device comprising at least one probe for emission of electromagnetic radiation towards a determined test point where the object being tested is located, as well as a support for the object being tested, wherein the test device further comprises a mechanical displacement device for moving the at least one probe according to an angular displacement following a predetermined angular spread statistic around a determined fixed principal aiming direction passing through the test point, to generate electromagnetic radiation having the predetermined angular spread statistic around the determined fixed principal aiming direction and to reproduce a scenario of angular spread defined for the electromagnetic radiation.

* * * * *